US012712522B2

(12) United States Patent
Shin et al.

(10) Patent No.: US 12,712,522 B2
(45) Date of Patent: Aug. 18, 2026

(54) EMBEDDED CAPACITORS WITH BURIED METAL LAYER UNDERNEATH BULK ACOUSTIC WAVE RESONATOR FOR ELECTROMECHANICAL COUPLING COEFFICIENT CONTROL

(71) Applicant: SKYWORKS GLOBAL PTE. LTD., Singapore (SG)

(72) Inventors: Kwang Jae Shin, Yongin (KR); Xiangnan Pang, Irvine, CA (US); Jae Hyung Lee, Seoul (KR); Taecheol Shon, Hwaseong (KR)

(73) Assignee: SKYWORKS GLOBAL PTE. LTD., Singapore (SG)

( * ) Notice: Subject to any disclaimer, the term of this patent is extended or adjusted under 35 U.S.C. 154(b) by 88 days.

(21) Appl. No.: 18/405,300

(22) Filed: Jan. 5, 2024

(65) Prior Publication Data

US 2024/0243722 A1 Jul. 18, 2024

Related U.S. Application Data

(60) Provisional application No. 63/480,194, filed on Jan. 17, 2023.

(51) Int. Cl.

| | |
|---|---|
| ***H03H 9/17*** | (2006.01) |
| ***H03H 9/54*** | (2006.01) |
| ***H03H 9/56*** | (2006.01) |

(52) U.S. Cl.

CPC ............ *H03H 9/173* (2013.01); *H03H 9/542* (2013.01); *H03H 9/568* (2013.01)

(58) Field of Classification Search

CPC ................................ H03H 9/173; H03H 9/54

See application file for complete search history.

(56) References Cited

U.S. PATENT DOCUMENTS

| | | | | |
|---|---|---|---|---|
| 6,924,583 | B2 | 8/2005 | Lin et al. | |
| 7,369,013 | B2 | 5/2008 | Fazzio et al. | |
| 7,658,858 | B2 | 2/2010 | Hong et al. | |
| 7,770,274 | B2 * | 8/2010 | Sano | H03H 9/173 29/25.35 |
| 9,450,167 | B2 * | 9/2016 | Zou | H03H 9/02102 |
| 9,577,603 | B2 | 2/2017 | Burak et al. | |
| 9,595,939 | B2 | 3/2017 | Link et al. | |
| 10,541,665 | B2 | 1/2020 | Lee et al. | |
| 10,601,391 | B2 | 3/2020 | Stokes et al. | |

(Continued)

FOREIGN PATENT DOCUMENTS

| | | | | |
|---|---|---|---|---|
| EP | 1998444 | A2 | 12/2008 | |
| EP | 4092910 | A1 * | 11/2022 | H03H 9/173 |

*Primary Examiner* — Andrea Lindgren Baltzell
*Assistant Examiner* — Alan Wong
(74) *Attorney, Agent, or Firm* — Lando & Anastasi, LLP

(57) ABSTRACT

Aspects and embodiments disclosed herein include a film bulk acoustic wave resonator comprising a substrate including a layer of dielectric material disposed on an upper surface of the substrate, a layer of piezoelectric material, a top electrode disposed on a top surface of the layer of piezoelectric material, a bottom electrode disposed on a bottom surface of the layer of piezoelectric material, a cavity defined between a lower surface of the bottom electrode and an upper surface of the layer of dielectric material, and a layer of conductive material buried within the layer of dielectric material at least partially beneath the cavity and the bottom electrode.

20 Claims, 15 Drawing Sheets

(56) References Cited

U.S. PATENT DOCUMENTS

| | | | | |
|---|---|---|---|---|
| 10,886,888 | B2 | 1/2021 | Ivira et al. | |
| 11,616,489 | B2 | 3/2023 | Wang | |
| 12,267,065 | B2 | 4/2025 | Liu et al. | |
| 12,289,097 | B2 | 4/2025 | Liu et al. | |
| 12,375,054 | B2 * | 7/2025 | Shirakawa | H03H 9/0504 |
| 12,388,410 | B2 | 8/2025 | Iwamoto | |
| 2007/0057599 | A1 * | 3/2007 | Motai | H03H 9/173<br>310/324 |
| 2007/0194863 | A1 | 8/2007 | Shibata et al. | |
| 2022/0321080 | A1 * | 10/2022 | Shirakawa | H03H 3/08 |
| 2022/0321095 | A1 | 10/2022 | Liu et al. | |
| 2022/0321100 | A1 | 10/2022 | Liu et al. | |
| 2022/0321101 | A1 | 10/2022 | Liu et al. | |
| 2023/0123285 | A1 | 4/2023 | Goto et al. | |
| 2023/0124493 | A1 | 4/2023 | Shin et al. | |
| 2023/0216462 | A1 | 7/2023 | Shi et al. | |
| 2023/0216478 | A1 | 7/2023 | Caron et al. | |
| 2025/0219615 | A1 | 7/2025 | Abbott et al. | |
| 2025/0323625 | A1 | 10/2025 | Liu et al. | |
| 2025/0392284 | A1 | 12/2025 | Liu et al. | |
| 2026/0005673 | A1 | 1/2026 | He et al. | |

* cited by examiner 110B
110A
110
120
315
125
310
135
305

EMBEDDED CAPACITORS WITH BURIED METAL LAYER UNDERNEATH BULK ACOUSTIC WAVE RESONATOR FOR ELECTROMECHANICAL COUPLING COEFFICIENT CONTROL

CROSS-REFERENCE TO RELATED APPLICATIONS

This application claims priority under 35 U.S.C. § 119(e) to U.S. Provisional Patent Application Ser. No. 63/480,194, titled "EMBEDDED CAPACITORS WITH BURIED METAL LAYER UNDERNEATH BULK ACOUSTIC WAVE RESONATOR FOR ELECTROMECHANICAL COUPLING COEFFICIENT CONTROL," filed Jan. 17, 2023, the entire content of which is incorporated by reference herein for all purposes.

BACKGROUND

Technical Field

Embodiments of this disclosure relate to acoustic wave devices, specifically bulk acoustic wave resonators and electronic devices and modules including same.

Description of Related Technology

Acoustic wave devices, for example, bulk acoustic wave (BAW) devices may be utilized as components of filters in radio frequency electronic systems. For instance, filters in a radio frequency front end of a mobile phone can include acoustic wave filters. Two acoustic wave filters can be arranged as a duplexer.

SUMMARY

In accordance with one aspect, there is provided a film bulk acoustic wave resonator. The film bulk acoustic wave resonator comprises a substrate including a layer of dielectric material disposed on an upper surface of the substrate, a layer of piezoelectric material, a top electrode disposed on a top surface of the layer of piezoelectric material, a bottom electrode disposed on a bottom surface of the layer of piezoelectric material, a cavity defined between a lower surface of the bottom electrode and an upper surface of the layer of dielectric material, and a layer of conductive material buried within the layer of dielectric material at least partially beneath the cavity and the bottom electrode.

In some embodiments, at least a portion of an upper surface of the layer of conductive material is disposed beneath the upper surface of the layer of dielectric material.

In some embodiments, at least a portion of a lower surface of the layer of conductive material is disposed above a lower surface of the layer of dielectric material.

In some embodiments, the layer of conductive material is electrically connected to the top electrode.

In some embodiments, a portion of the layer of conductive material extends outward from an area beneath the cavity and electrically connects to a top electrical contact that is electrically connected to the top electrode.

In some embodiments, the film bulk acoustic wave resonator further comprises a through-substrate via passing through the substrate and electrically connecting the layer of conducting material to an electrical contact disposed on a lower surface of the substrate.

In some embodiments, the layer of conductive material is electrically connected to neither the top electrode nor the bottom electrode.

In some embodiments, the layer of conductive material is electrically floating.

In some embodiments, the layer of conductive material is disposed entirely beneath the cavity.

In some embodiments, the film bulk acoustic wave resonator of further comprises a through-substrate via passing through the substrate and electrically connecting the layer of conducting material to an electrical contact disposed on a lower surface of the substrate.

In some embodiments, the layer of conductive material is electrically connected to the bottom electrode.

In some embodiments, the layer of conductive material is directly connected to the bottom electrode.

In some embodiments, the film bulk acoustic wave resonator further comprises a through-substrate via passing through the substrate and electrically connecting the layer of conducting material to an electrical contact disposed on a lower surface of the substrate.

In some embodiments, the layer of conductive material changes an electromechanical coupling coefficient of the film bulk acoustic wave resonator.

In some embodiments, the layer of conductive material lowers the electromechanical coupling coefficient of the film bulk acoustic wave resonator.

In some embodiments, the layer of conductive material defines a first plate of a capacitor and one of the top electrode or the bottom electrode defines a second plate of the capacitor.

In accordance with another aspect, there is provided a ladder filter including a series arm film bulk acoustic wave resonator. The series arm film bulk acoustic wave resonator comprises a substrate including a layer of dielectric material disposed on an upper surface of the substrate, a layer of piezoelectric material, a top electrode disposed on a top surface of the layer of piezoelectric material, a bottom electrode disposed on a bottom surface of the layer of piezoelectric material, a cavity defined between a lower surface of the bottom electrode and an upper surface of the layer of dielectric material, and a layer of conductive material buried within the layer of dielectric material at least partially beneath the cavity and bottom electrode.

In some embodiments, the ladder filter further comprises a capacitor electrically connected in parallel to the series arm bulk acoustic wave resonator.

In some embodiments, the layer of conductive material defines a first plate of the capacitor and one of the top electrode or the bottom electrode defines a second plate of the capacitor.

In some embodiments, the ladder filter is includes in an electronic device.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
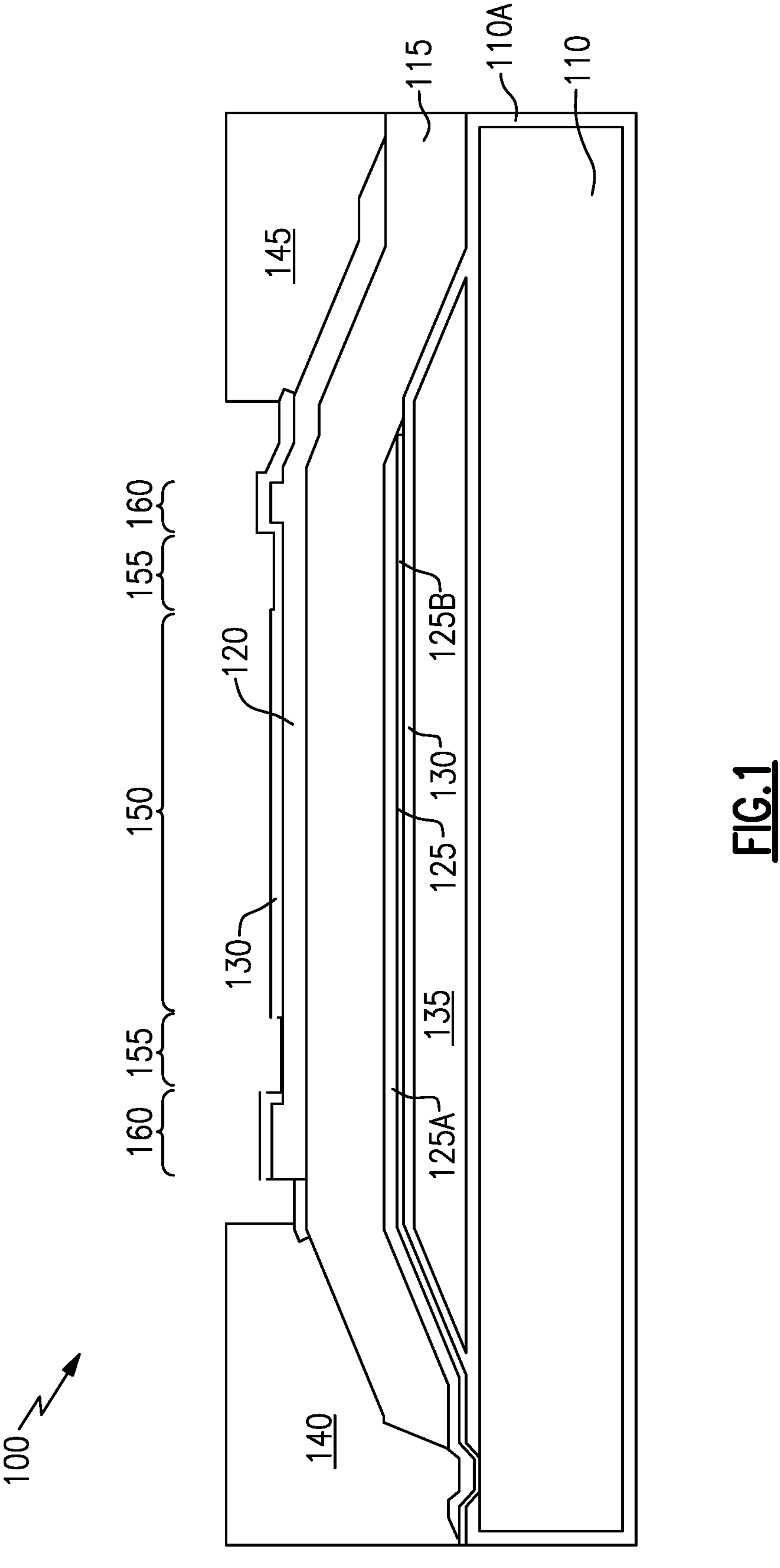
FIG. 1 is a simplified cross-sectional diagram of an example of a film bulk acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale and that some intermediate materials or layers are not illustrated. Moreover, it will be understood that certain embodiments can include more elements than illustrated in a drawing and/or a subset of the elements illustrated in a drawing. Further, some embodiments can incorporate any suitable combination of features from two or more drawings.

Film bulk acoustic wave resonators are a form of bulk acoustic wave (BAW) resonator that generally includes a film of piezoelectric material sandwiched between a top electrode and a bottom electrode and suspended over a cavity that allows for the film of piezoelectric material to vibrate. A signal applied across the top and bottom electrodes causes an acoustic wave to be generated in and travel through the film of piezoelectric material. A film bulk acoustic wave resonator exhibits a frequency response to applied signals with a resonance peak determined by a thickness of the film of piezoelectric material. Ideally, the only acoustic wave that would be generated in a film bulk acoustic wave resonator is a main acoustic wave that would travel through the film of piezoelectric material in a direction perpendicular to layers of conducting material forming the top and bottom electrodes, sometimes referred to as "piston mode" operation. The piezoelectric material of a film bulk acoustic wave resonator, however, typically has a non-zero Poisson's ratio. Compression and relaxation of the piezoelectric material associated with passage of the main acoustic wave may thus cause compression and relaxation of the piezoelectric material in a direction perpendicular to the direction of propagation of the main acoustic wave. The compression and relaxation of the piezoelectric material in the direction perpendicular to the direction of propagation of the main acoustic wave may generate transverse acoustic waves that travel perpendicular to the main acoustic wave (parallel to the surfaces of the electrode films) through the piezoelectric material. The transverse acoustic waves may be reflected back into an area in which the main acoustic wave propagates and may induce spurious acoustic waves travelling in the same direction as the main acoustic wave. These spurious acoustic waves may degrade the frequency response of the film bulk acoustic wave resonator from what is expected or from what is intended and are generally considered undesirable.

FIG. 1 is cross-sectional view of an example of a film bulk acoustic wave resonator, indicated generally at 100, having what may be referred to as a mesa structure. The film bulk acoustic wave resonator 100 is disposed on a substrate 110, for example, a silicon substrate. The substrate 110 may be formed of, for example, high resistivity intrinsic silicon or another material exhibiting a high electrical resistivity. The film bulk acoustic wave resonator 100 may include a layer of dielectric material 110A of, for example, silicon dioxide disposed on the surface of the substrate around the bulk high resistivity material of the substrate. The film bulk acoustic wave resonator 100 includes a layer or film of piezoelectric material 115, for example, aluminum nitride (AlN). A top electrode 120 is disposed on top of a portion of the layer or film of piezoelectric material 115 and a bottom electrode 125 is disposed on the bottom of a portion of the layer or film of piezoelectric material 115. The top electrode 120 may be formed of, for example, ruthenium (Ru), molybdenum (Mo), or a Ru/Mo alloy. The bottom electrode 125 may include a layer 125A of Ru (or Mo or Ru/Mo alloy) disposed in contact with the bottom of the portion of the layer or film of piezoelectric material 115 and a layer 125B of titanium (Ti) disposed on a lower side of the layer 125A of Ru opposite a side of the layer 125A of Ru in contact with the bottom of the portion of the layer or film of piezoelectric material 115. Each of the top electrode 120 and the bottom electrode 125 may be covered with a layer of dielectric material 130, for example, silicon dioxide. A cavity 135 is defined beneath the layer of dielectric material 130 covering the bottom electrode 125 and the layer of dielectric material 110A of the substrate 110. A bottom electrical contact 140 formed of, for example, copper may make electrical connection with the bottom electrode 125 and a top electrical contact 145 formed of, for example, copper may make electrical connection with the top electrode 120.

The film bulk acoustic wave resonator 100 may include a central region 150 including a main active domain in the layer or film of piezoelectric material 115 in which a main acoustic wave is excited during operation. The central region 150 may also be referred to as the active area of the film bulk acoustic wave resonator 100. The central region may have a width of, for example, between about 20 μm and about 100 μm. A recessed frame region or regions 155 may bound and define the lateral extent of the central region 150. The recessed frame regions may have a width of, for example, about 1 μm. The recessed frame region(s) 155 may be defined by areas that have a thinner layer of dielectric material 130 on top of the top electrode 120 than in the central region 150. The dielectric material layer 130 in the recessed frame region(s) 155 may be from about 10 nm to about 100 nm thinner than the dielectric material layer 130 in the central region 150. The difference in thickness of the dielectric material in the recessed frame region(s) 155 vs. in the central region 150 may cause the resonant frequency of the device in the recessed frame region(s) 155 to be between about 5 MHz to about 50 MHz higher than the resonant frequency of the device in the central region 150. In some embodiments, the thickness of the dielectric material layer 130 in the central region 150 may be about 200 nm to about 300 nm and the thickness of the dielectric material layer 130 in the recessed frame region(s) 155 may be about 100 nm. The dielectric film 300 in the recessed frame region(s) 155 is typically etched during manufacturing to achieve a desired difference in acoustic velocity between the central region 150 and the recessed frame region(s) 155. Accordingly, the dielectric film 300 initially deposited in both the central region 150 and recessed frame region(s) 155 is deposited with a sufficient thickness that allows for etching of sufficient dielectric film 300 in the recessed frame region(s) 155 to achieve a desired difference in thickness of the dielectric film 300 in the central region 150 and recessed frame region(s) 155 to achieve a desired acoustic velocity difference between these regions.

A raised frame region or regions 160 may be defined on an opposite side of the recessed frame region(s) 155 from the central region 150 and may directly abut the outside edge(s) of the recessed frame region(s) 155. The raised frame regions may have widths of, for example, about 1 μm. The raised frame region(s) 160 may be defined by areas where the top electrode 120 is thicker than in the central region 150 and in the recessed frame region(s) 155. The top electrode 120 may have the same thickness in the central region 150 and in the recessed frame region(s) 155 but a greater thickness in the raised frame region(s) 160. The top electrode 120 may be between about 50 nm and about 500 nm thicker in the raised frame region(s) 160 than in the central region 150 and/or in the recessed frame region(s) 155. In some embodiments the thickness of the top electrode in the central region may be between 50 and 500 nm. In other embodiments, the top electrode 120 may have the same thickness in the central region 150, the recessed frame region(s) 155, and the raised frame region(s) 160, and the raised frame may be defined by a thicker layer of dielectric film 300 in the raised frame regions than in the central region 150 and recessed frame region(s) 155.

The recessed frame region(s) 155 and the raised frame region(s) 160 may contribute to dissipation or scattering of transverse acoustic waves generated in the film bulk acoustic wave resonator 100 during operation and/or may reflect transverse waves propagating outside of the recessed frame region(s) 155 and the raised frame region(s) 160 and prevent these transverse acoustic waves from entering the central region and inducing spurious signals in the main active domain region of the film bulk acoustic wave resonator. Without being bound to a particular theory, it is believed that due to the thinner layer of dielectric material 130 on top of the top electrode 120 in the recessed frame region(s) 155, the recessed frame region(s) 155 may exhibit a higher velocity of propagation of acoustic waves than the central region 150. Conversely, due to the increased thickness and mass of the top electrode 120 in the raised frame region(s) 160, the raised frame regions(s) 160 may exhibit a lower velocity of propagation of acoustic waves than the central region 150 and a lower velocity of propagation of acoustic waves than the recessed frame region(s) 155. The discontinuity in acoustic wave velocity between the recessed frame region(s) 155 and the raised frame region(s) 160 creates a barrier that scatters, suppresses, and/or reflects transverse acoustic waves.

Figure 2A:
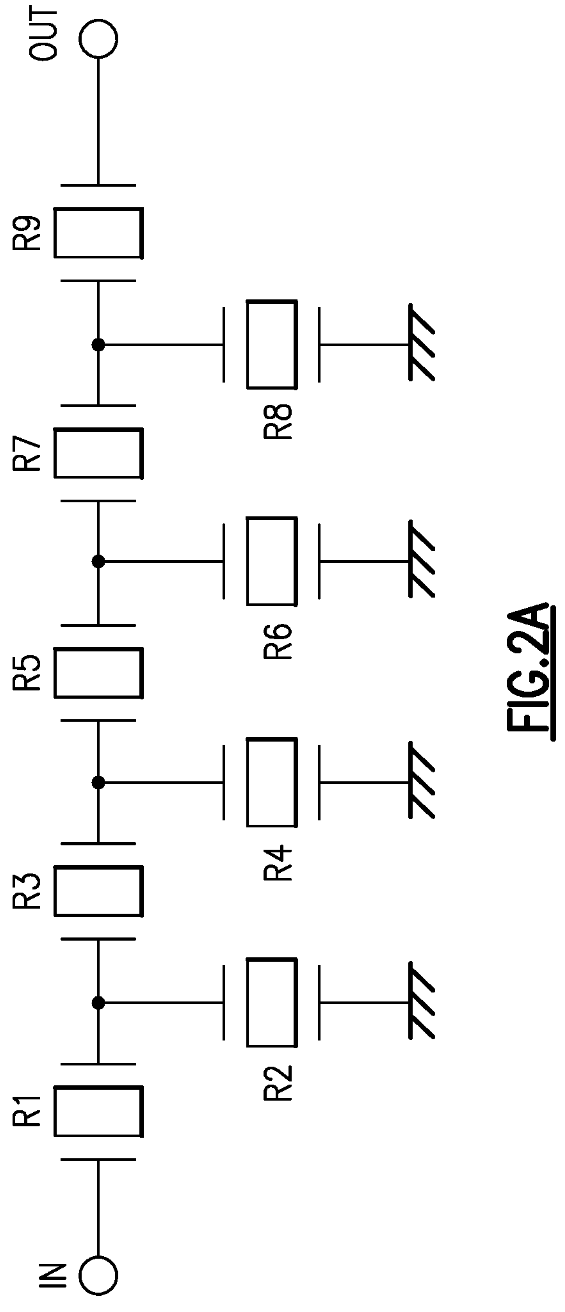
FIG. 2A is a circuit diagram of an example of a ladder filter including bulk acoustic wave resonators.

In some embodiments, multiple BAWs, or, specifically, film bulk acoustic wave resonators as disclosed herein may be combined into a filter, for example, an RF ladder filter schematically illustrated in FIG. 2A and including a plurality of series resonators R1, R3, R5, R7, and R9, and a plurality of parallel (or shunt) resonators R2, R4, R6, and R8. As shown, the plurality of series resonators R1, R3, R5, R7, and R9 are connected in series between the input and the output of the RF ladder filter, and the plurality of parallel resonators R2, R4, R6, and R8 are respectively connected between series resonators and ground in a shunt configuration.

Figure 2B:
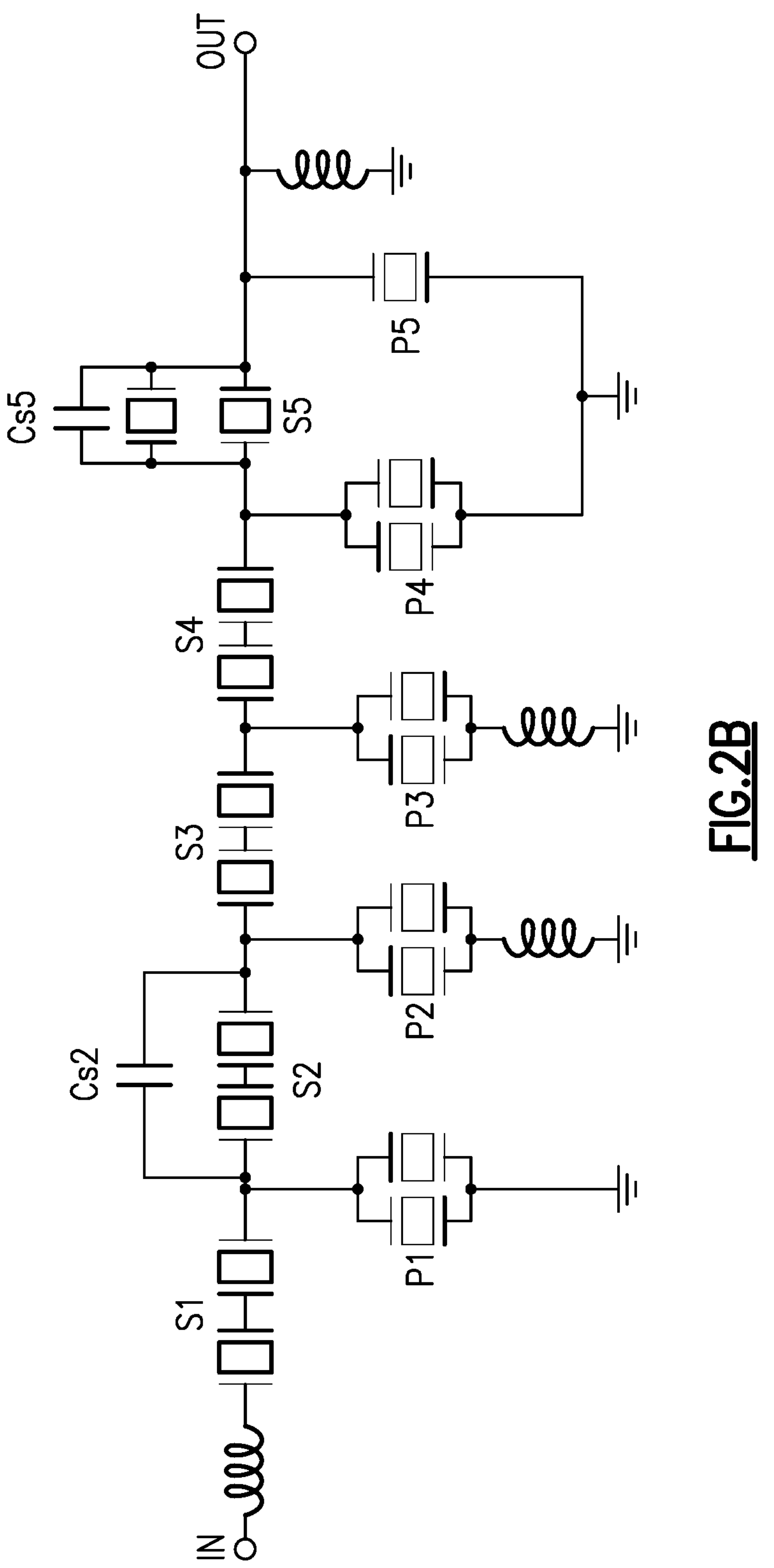
FIG. 2B is a circuit diagram of an example of a ladder filter including bulk acoustic wave resonators and capacitors connected in parallel with series arm bulk acoustic wave resonators.

In some examples, a ladder filter may be formed with one or more series or shunt resonators cascaded, for example, with more than one resonator connected in series in place of any one of the resonators R1-R9 of FIG. 2A or with one or more of the series or shunt resonators split, for example, with more than one resonator connected in parallel in place of any one of the resonators R1-R9 of FIG. 2A. One example of such a ladder filter with both cascaded and split series and shunt resonators is illustrated in simplified view in FIG. 2B. In the ladder filter of FIG. 2B the two series resonators designated at S1 are connected in series and are thus considered cascaded. The two series resonators designated at S5 as well as the two shunt resonators designated at P1 are connected in parallel and are thus considered arranged in a split configuration. The provision of cascaded (series connected) or split (parallel connected) resonator elements may, for example, improve power handling capabilities of the ladder filter and/or shape the passband of the ladder filter in a manner desired for a particular implementation.

Figure 2C:
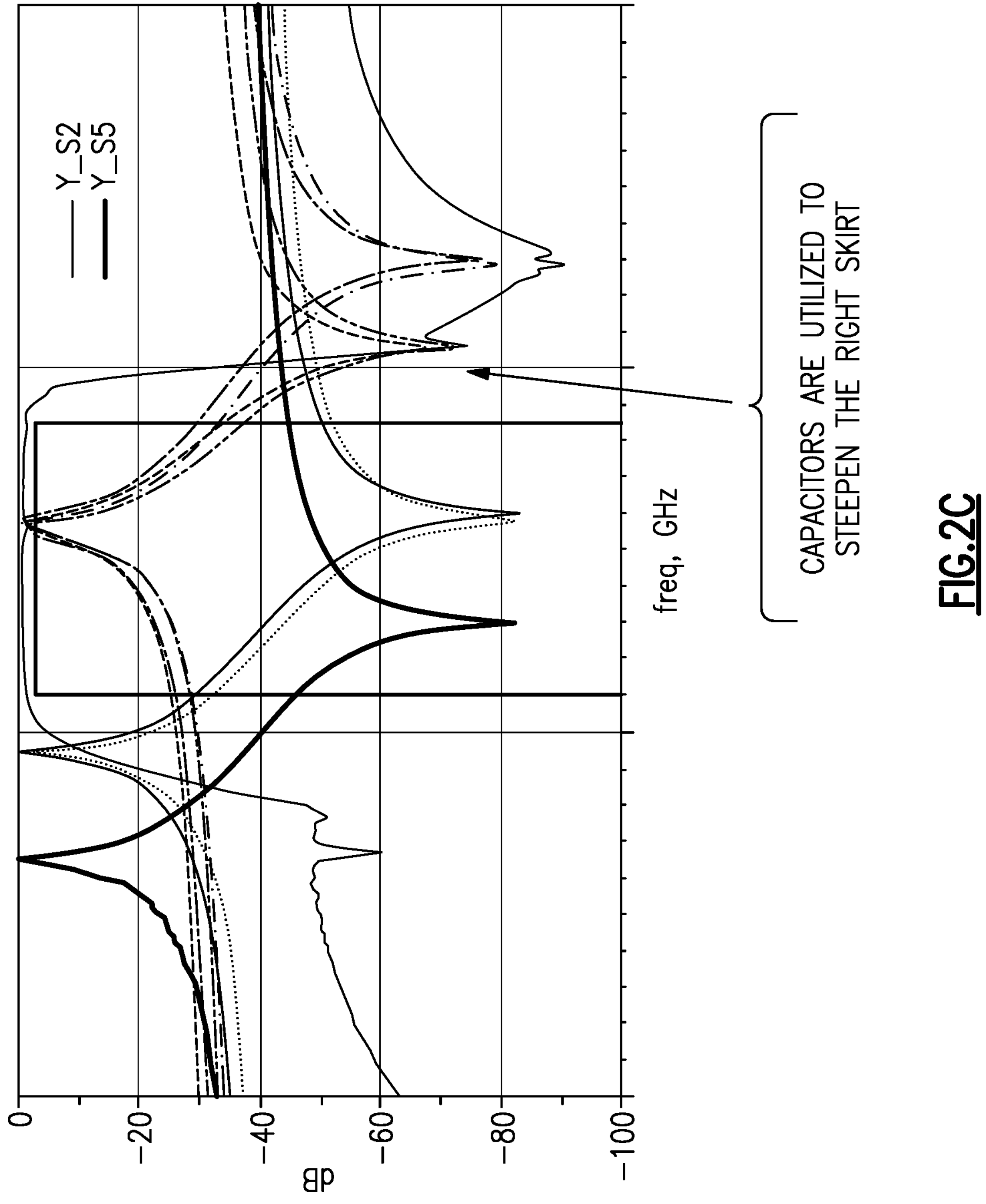
FIG. 2C illustrates the passband of a ladder filter such as illustrated in FIG. 2B.

In some implementations, capacitors may be added in parallel to one or more resonators in a ladder filter. For example, in the ladder filter illustrated in FIG. 2 capacitor Cs2 is connected in parallel with the two series resonators designated at S2 and the capacitor Cs5 is connected in parallel with the split (parallel connected) series resonators designated at S5. The provision of capacitors such as Cs2 and/or Cs5 in parallel with one or more series resonators in a ladder filter may contribute to increasing the steepness of the skirt at the upper side of the passband of the ladder filter, that is, the rate at which the admittance parameter of the ladder filter drops with increasing frequency at the high frequency side of the passband of the ladder filter. (See FIG. 2C) The provision of capacitors such as Cs2 and/or Cs5 in parallel with one or more shunt resonators in a ladder filter may also decrease the electromechanical coupling coefficient Kt2 of the resonators to which they are connected in parallel.

Capacitors such as capacitors Cs2 or Cs5 may be formed as metal-oxide-metal or metal-insulator-metal layer stacks separate from the resonators of the ladder filter. Such capacitor structures, however, generally increase the size of a die upon which the ladder filter is formed, which is considered undesirable in terms of the number of filters that may be formed on a single wafer and the die yield of the filters. Accordingly, it may be desirable to integrate the capacitor structures into the structure of the resonators of the ladder filter to avoid separate capacitor structures and maintain a reduced die size.

Figure 3A:
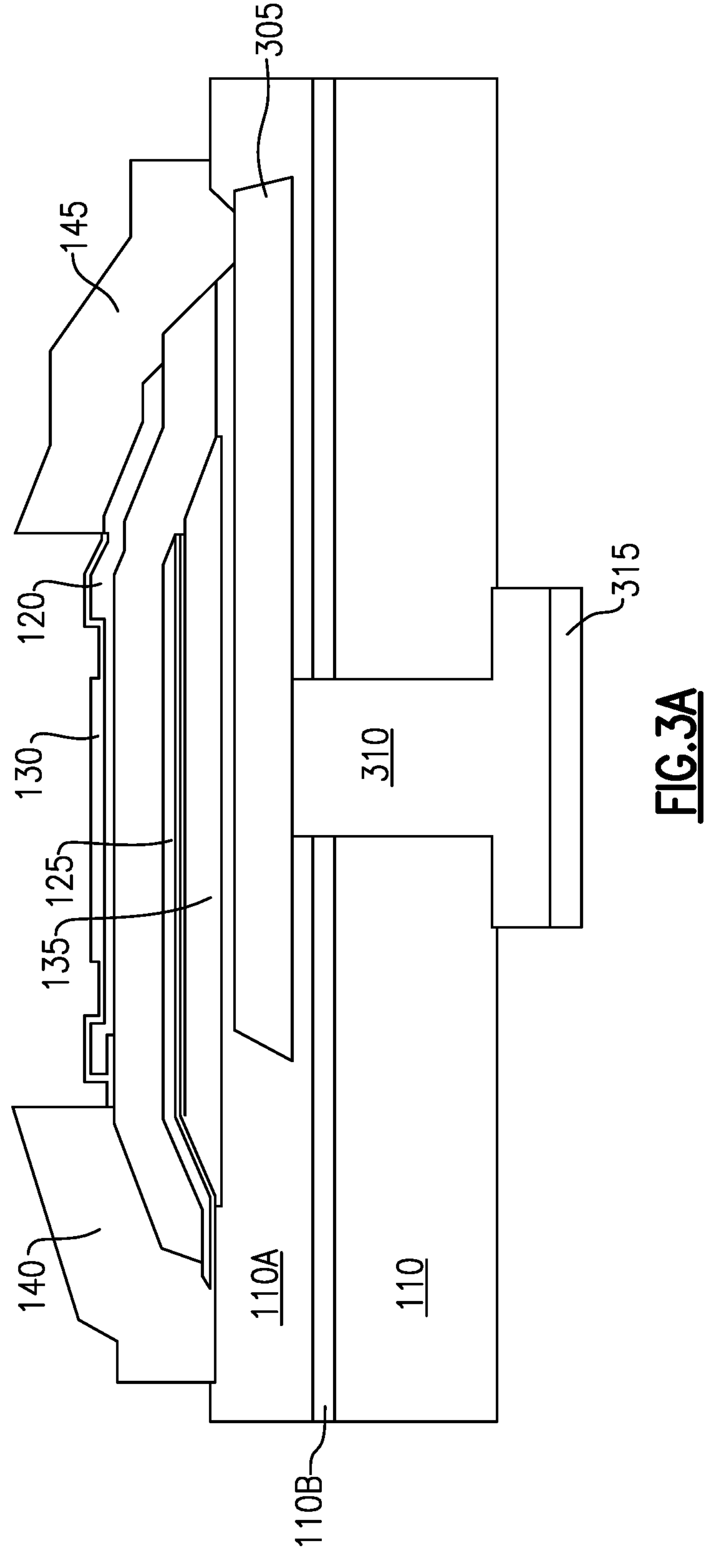
FIG. 3A is a cross-sectional view of one example of a film bulk acoustic wave resonator including a buried metal layer.

One method and structure for integrating a capacitor into a film bulk acoustic wave resonator is illustrated in FIG. 3A. Similar features as illustrated in the film bulk acoustic wave resonator of FIG. 1 are given the same reference numbers in the structure illustrated in FIG. 3A. In the structure of FIG.

3A, a layer of conductive material 305, for example, a metal layer made of a low resistivity material, such as one or more of aluminum (Al), copper (Cu), silver (Ag) and gold (Au) and/or a material with a high melting temperature, such as one or more of molybdenum (Mo), ruthenium (Ru), platinum (Pt), tungsten (W) and chromium (Cr) is buried within the layer of dielectric material 110A. The layer of dielectric material 110A is illustrated with a greater thickness in FIG. 3A than in FIG. 1. Portions of the layer of conductive material 305 may be separated from the cavity 135 by an upper portion of the layer of dielectric material 110A and from the substrate 110 (illustrated as including an optional trap-rich surface layer 110B in FIG. 3A) by a lower portion of the layer of dielectric material 110A. The layer of conductive material 305 is electrically connected to the top electrode 120 through the top electrical contact 145. A through substrate via 310 is electrically connected to a lower side of the layer of conductive material 305 and passes through the lower portion of the layer of dielectric material 110A, the trap-rich layer 110B, and the substrate 110 and electrically connects to a contact pad 315 on a lower side of the substrate for electrically connecting to and mounting on a packing substrate, for example, a printed circuit board. A capacitor is thus formed with the buried layer of conductive material 305 and top electrode 120 together forming plates of a first polarity and the bottom electrode 125 forming a plate of opposite polarity or a ground plate.

Figure 3B:
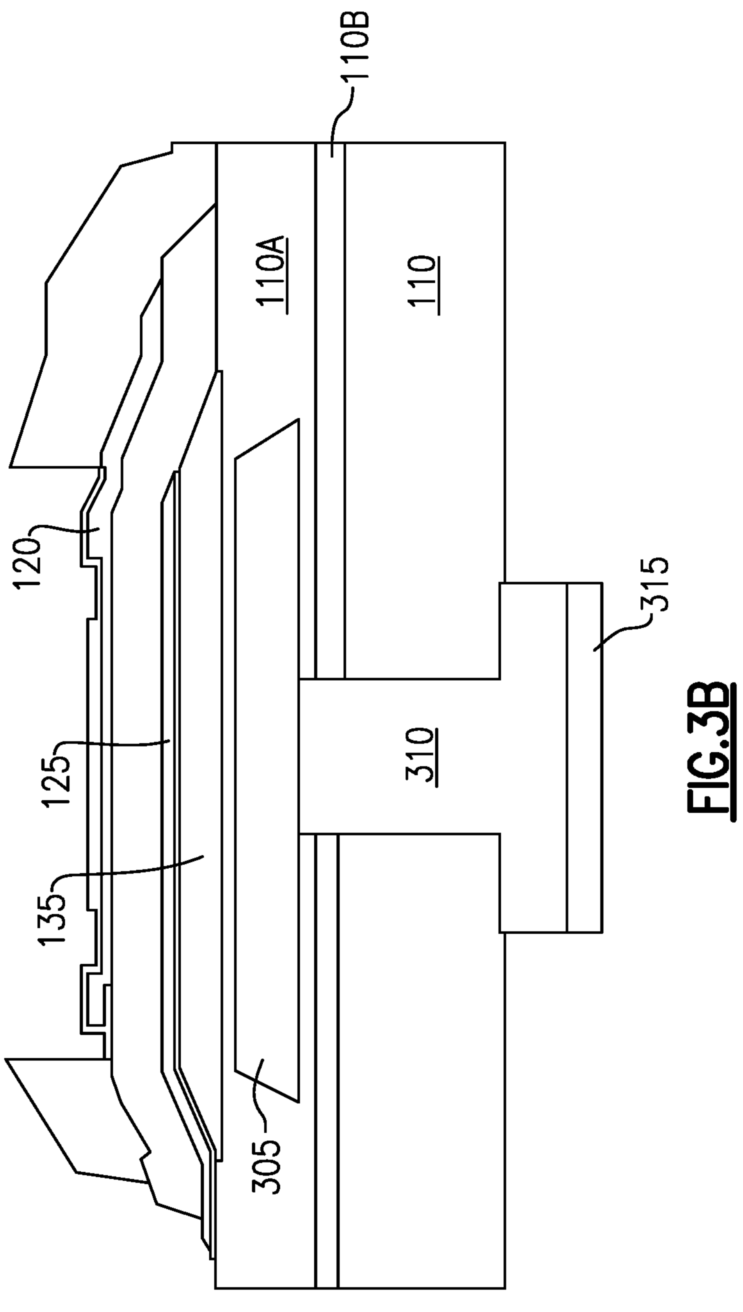
FIG. 3B is a cross-sectional view of another example of a film bulk acoustic wave resonator including a buried metal layer.

In a second embodiment, illustrated in FIG. 3B, the buried layer of conductive material 305 is not electrically connected to either the top electrode 120 or the bottom electrode 125. The layer of conductive material 305 is separated from the bottom electrode 125 by the cavity 135. The layer of conductive material 305 and the bottom electrode 125 form the opposite plates of a capacitor. In some examples of the embodiment illustrated in FIG. 3B the buried layer of conductive material 305 may be left electrically floating and unconnected to ground or any voltage source.

Figure 3C:
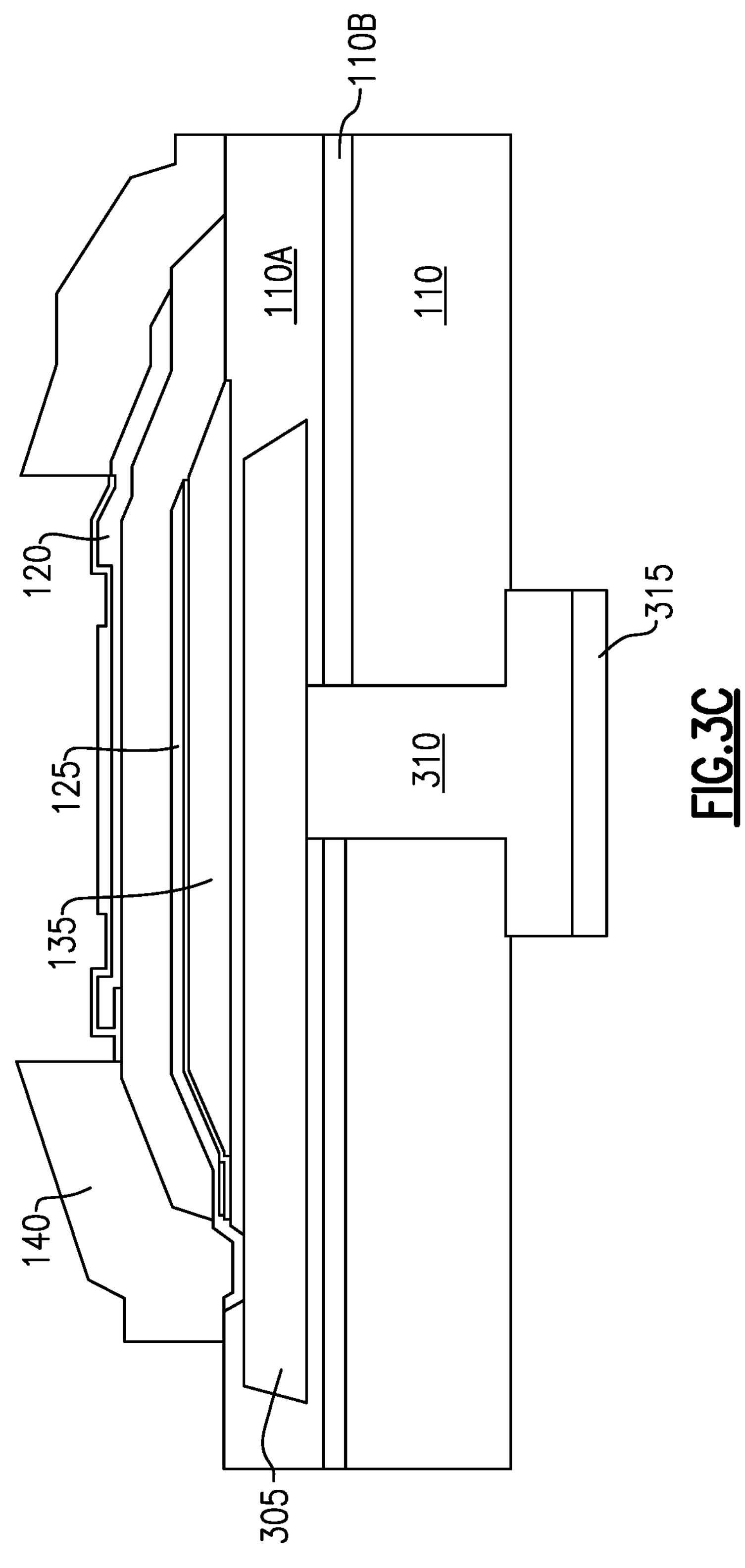
FIG. 3C is a cross-sectional view of another example of a film bulk acoustic wave resonator including a buried metal layer.

In a third embodiment, illustrated in FIG. 3C, the buried layer of conductive material 305 is electrically connected to the bottom electrode 125, either directly as illustrated, or through the bottom electrical contact 140. A capacitor is thus formed with the top electrode 120 forming one plate and the combination of bottom electrode 125 and buried layer of conductive material 305 forming the opposite plate.

Figure 4A:
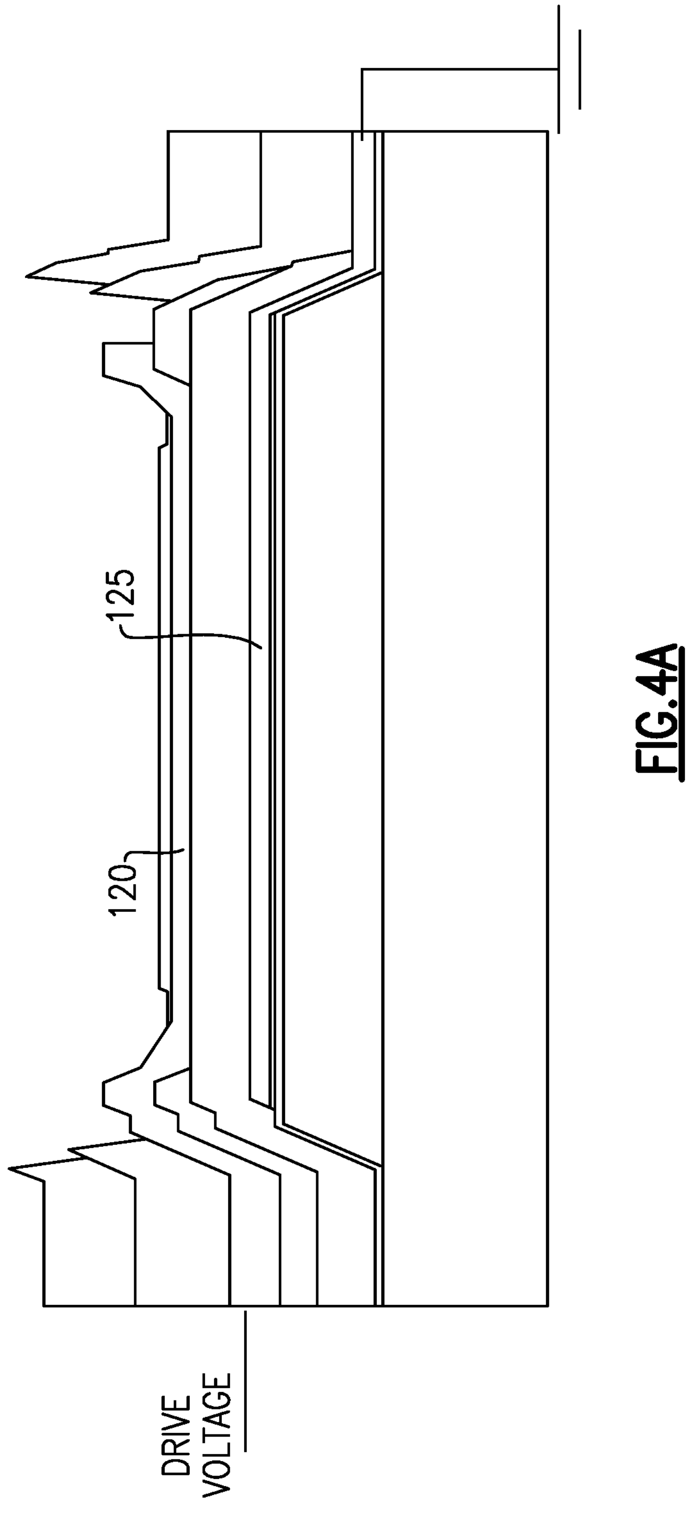
FIG. 4A illustrates electrical connections to a first simulated film bulk acoustic wave resonator structure.
Figure 4B:
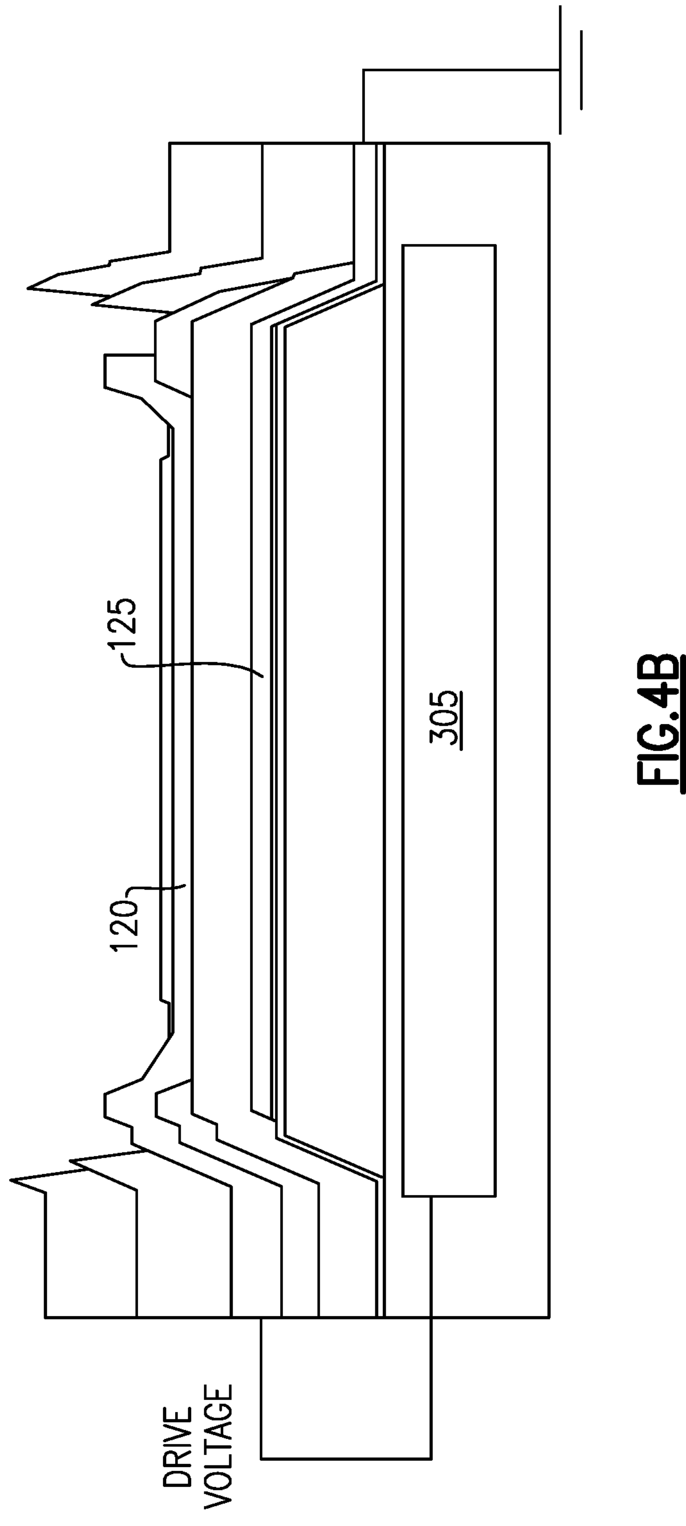
FIG. 4B illustrates electrical connections to another simulated film bulk acoustic wave resonator structure.
Figure 4C:
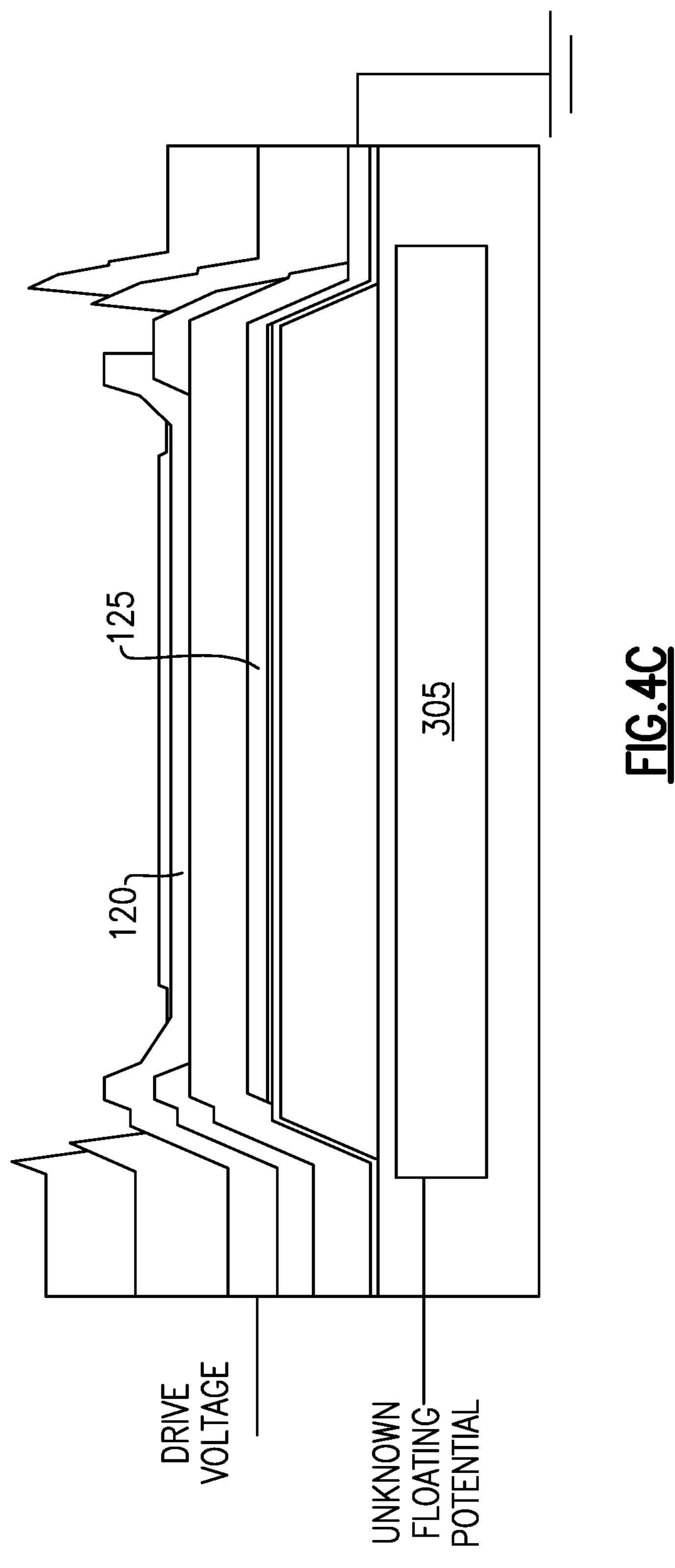
FIG. 4C illustrates electrical connections to another simulated film bulk acoustic wave resonator structure.
Figure 4D:
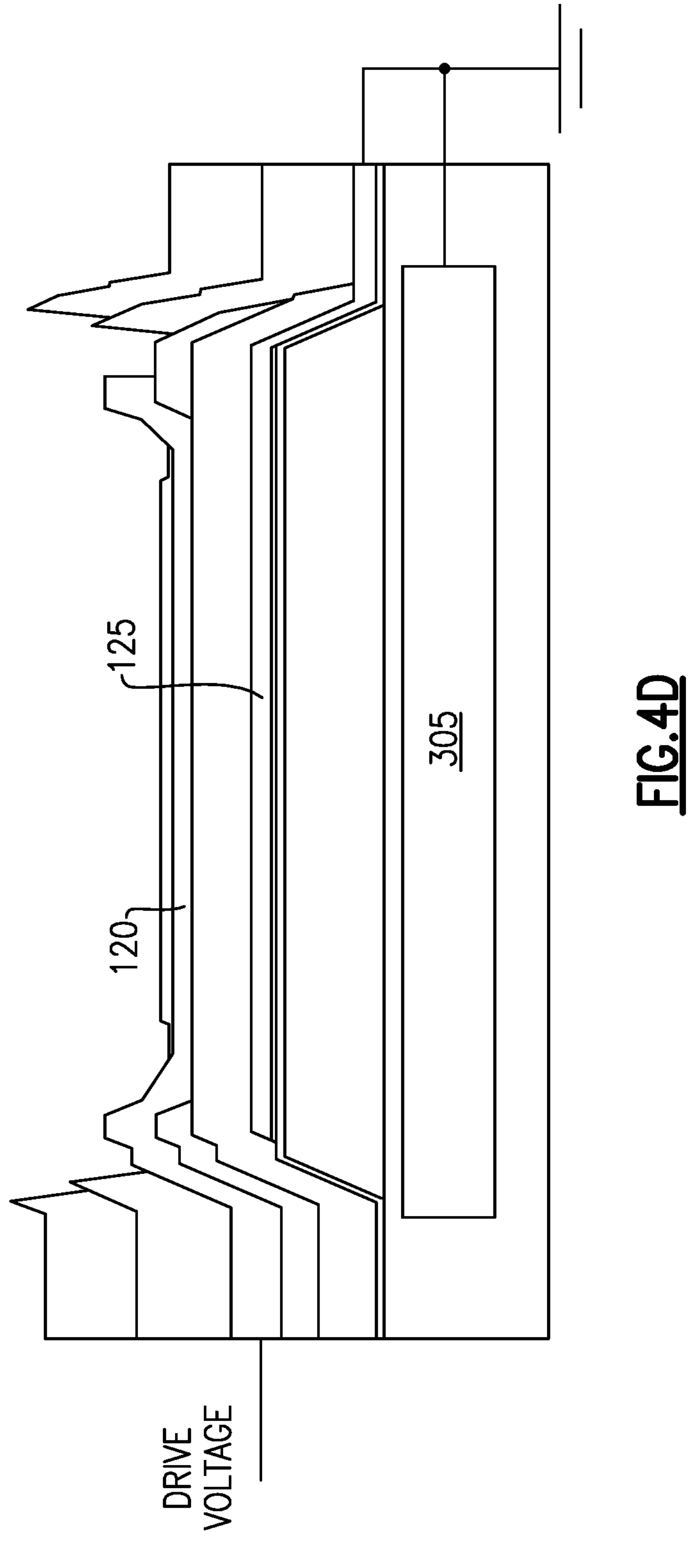
FIG. 4D illustrates electrical connections to another simulated film bulk acoustic wave resonator structure.

Simulations were performed to compare the effect on resonator electromechanical coupling coefficient of capacitor structures as illustrated in FIGS. 3A-3C against each other and against a baseline structure. FIGS. 4A-4D illustrate the simulated electrical connections. FIG. 4A illustrates the baseline or reference structure in which a drive voltage was applied to the top electrode 120 while the bottom electrode 125 was grounded (the "Ref" condition). This reference structure did not include any buried layer of conductive material. FIG. 4B illustrates a simulated structure corresponding to the embodiment of FIG. 3A in which a drive voltage was applied to both a buried layer of conductive material 305 and the top electrode 120 while the bottom electrode 125 was grounded (the "BM Connected2MTE" condition). FIG. 4C illustrates a simulated structure corresponding to the embodiment of FIG. 3B in which a which a drive voltage was applied to the top electrode 120 while the bottom electrode 125 was grounded and the buried layer of conductive material 305 was left electrically floating (the "BM Floating" condition). FIG. 4D illustrates a simulated structure corresponding to the embodiment of FIG. 3C in which a drive voltage was applied to the top electrode 120 while both the buried layer of conductive material 305 and the bottom electrode 125 were grounded (the "BM Connected2MBE" condition).

Figure 5:
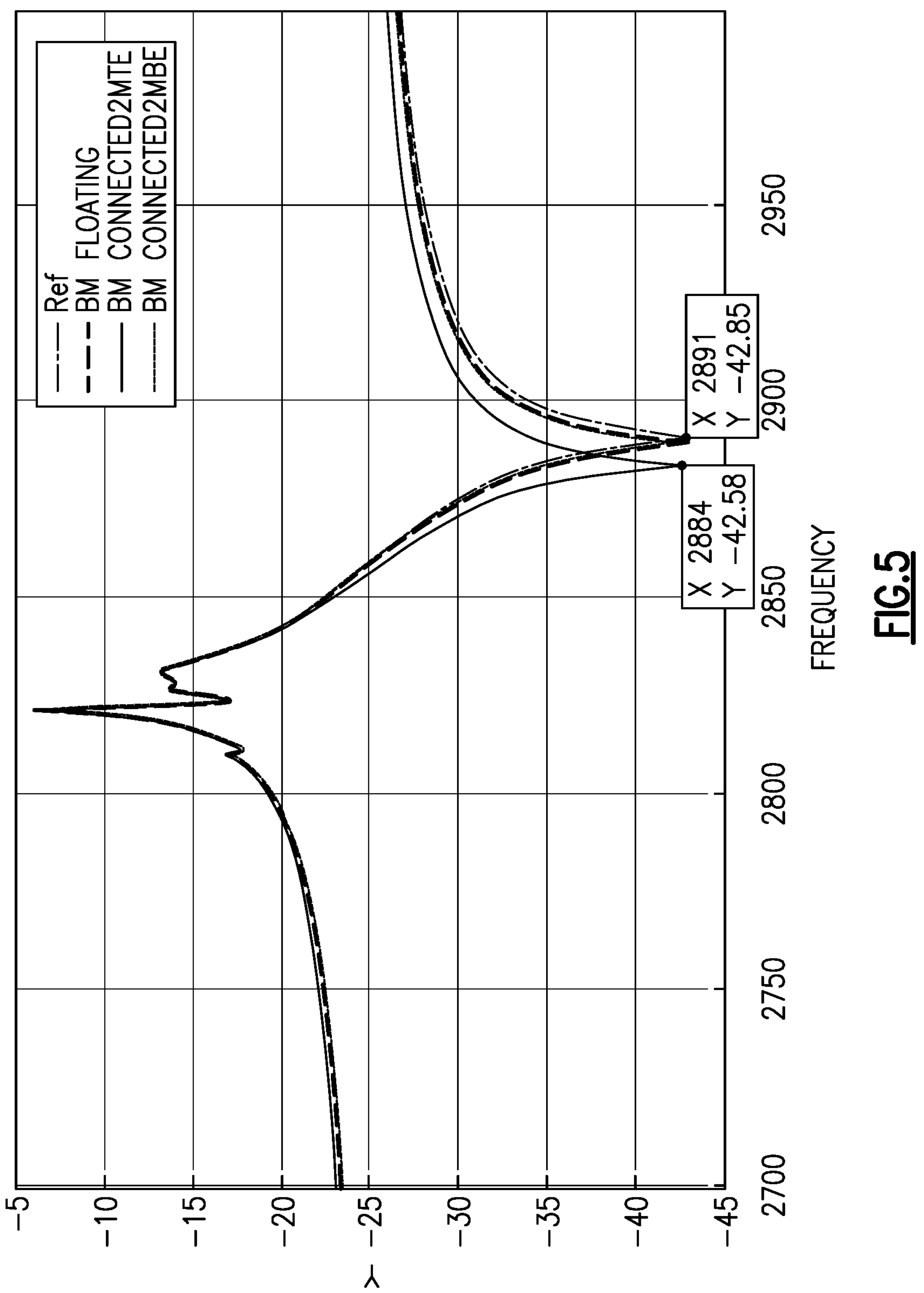
FIG. 5 illustrates results of simulations of the admittance curves of the film bulk acoustic wave resonator structures of FIGS. 4A-4D.

FIG. 5 illustrates simulated admittance curves for the resonators simulated as illustrated in FIGS. 4A-4D. There was negligible change in the resonance peak as compared to the Ref condition for any of the simulated resonators including the buried metal layer. Only the BM Connected2MTE condition exhibited a noticeable change in the resonator antiresonance frequency as compared to the Ref condition. Accordingly, among the configurations simulated, only the condition in which the buried metal layer was added to the resonator and electrically connected to the top electrode resulted in a reduction in electromechanical coupling coefficient Kt2 of the resonator. The degree to which the antiresonance frequency may be shifted as compared to the Ref condition would be dependent on the capacitance of the capacitor formed by the bottom electrode and the combination of the buried metal layer and the top electrode, which can be controlled by selecting the area of the buried metal layer.

Figure 6:
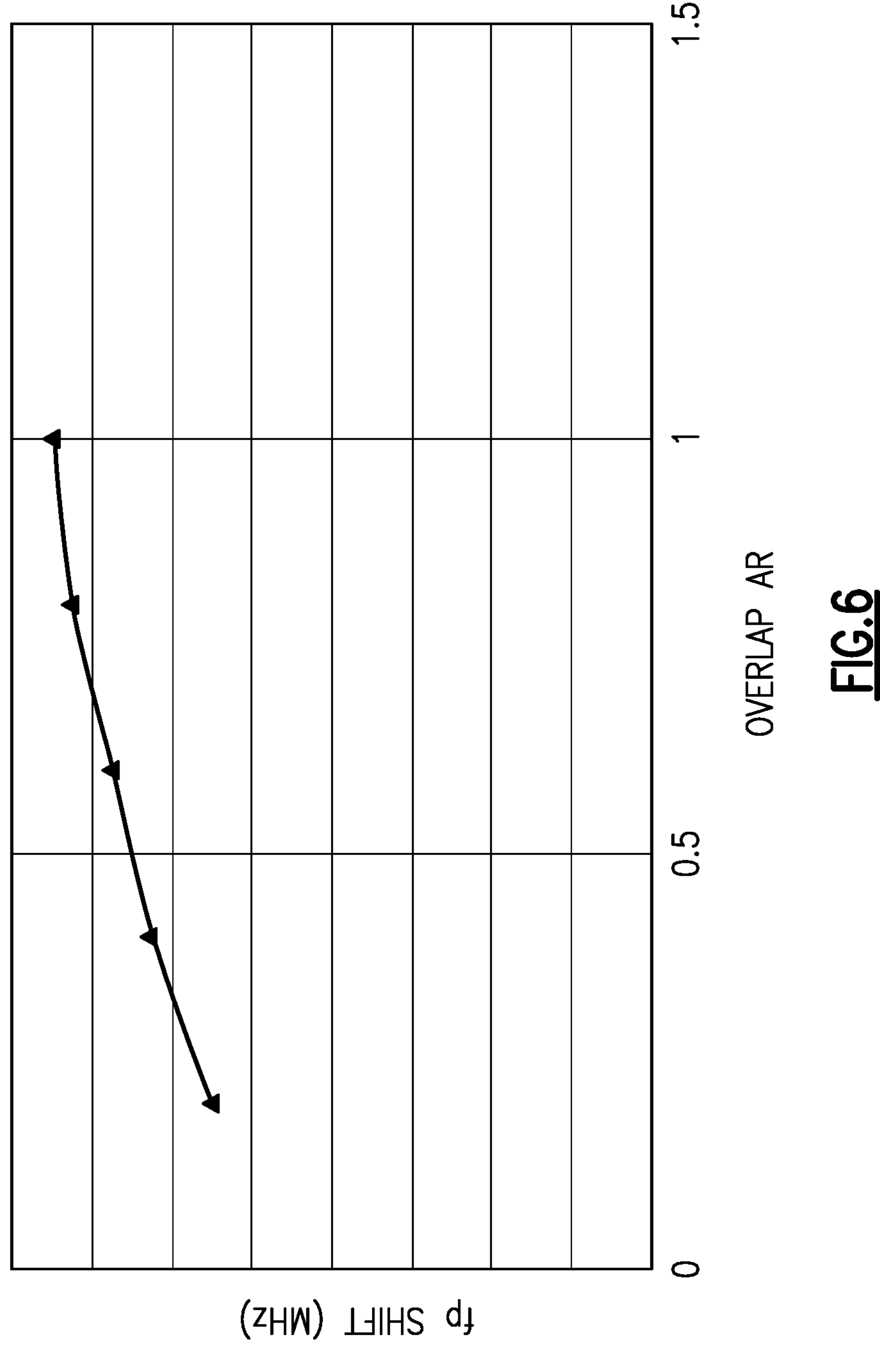
FIG. 6 illustrates results of simulation of shift in antiresonance frequency as a function of buried metal layer area for the film bulk acoustic wave resonator structure of FIG. 3A.

Simulations were performed to determine the effect of the area of the buried metal layer and its location on the degree to which the antiresonance frequency of a film bulk acoustic wave resonator may be shifted by inclusion of the buried metal layer. The area of the buried metal layer was characterized as an overlap area ratio "Overlap AR" which was defined as the area of the buried metal layer divided by the area of the active region of the resonator. Three cases for positioning of the buried metal layer were simulated and the shift in antiresonance frequency of the resonator due to the presence of the buried metal layer for each case was simulated for different Overlap AR values. The results of this simulation are illustrated in FIG. 6. As can be seen from these results by controlling the overlap area ratio of the buried metal layer, the antiresonant frequency may be shifted downward by higher overlap area ratio resulting in a greater frequency shift.

Other filter structures and other circuit structures known in the art that may include BAW devices or resonators, for example, duplexers, notch filters, baluns, etc., may also be formed including examples of BAW resonators as disclosed herein.

Figure 7:
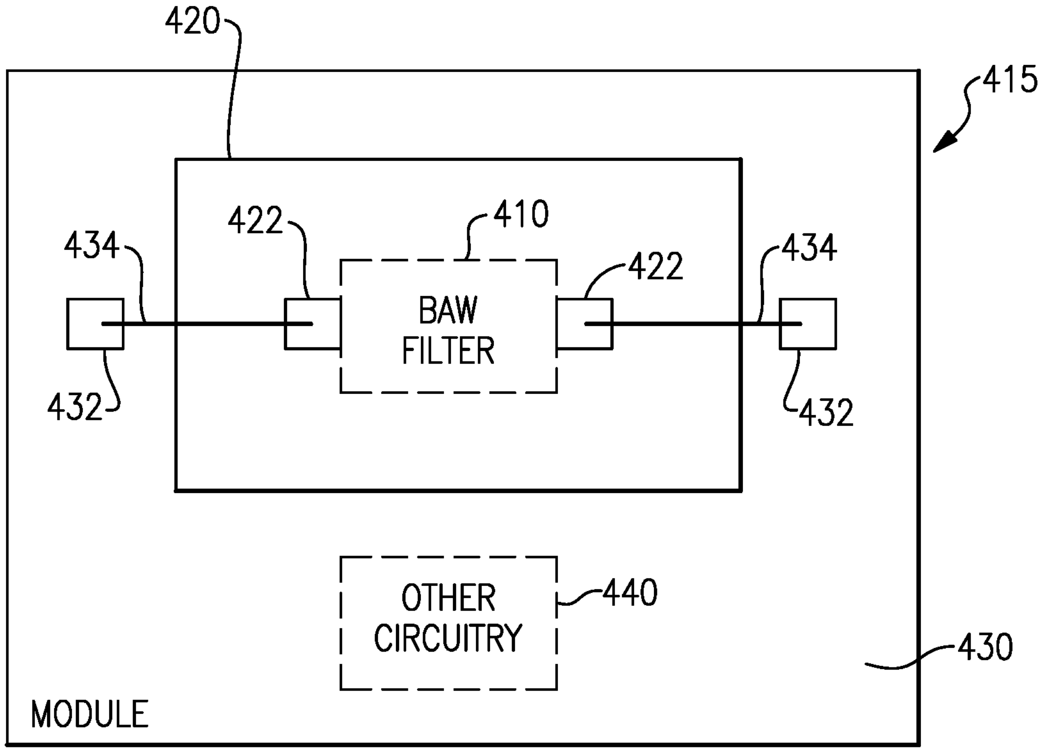
FIG. 7 a block diagram illustrating one example of an electronics module including a BAW filter.
Figure 8:
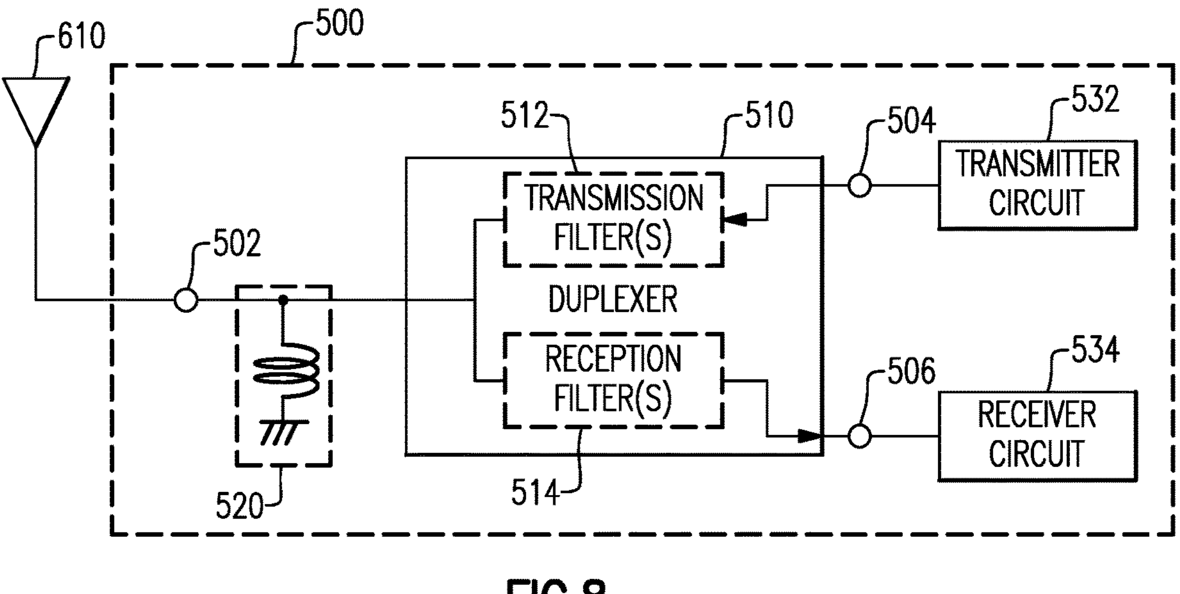
FIG. 8 is a block diagram of one example of a front-end module.
Figure 9:
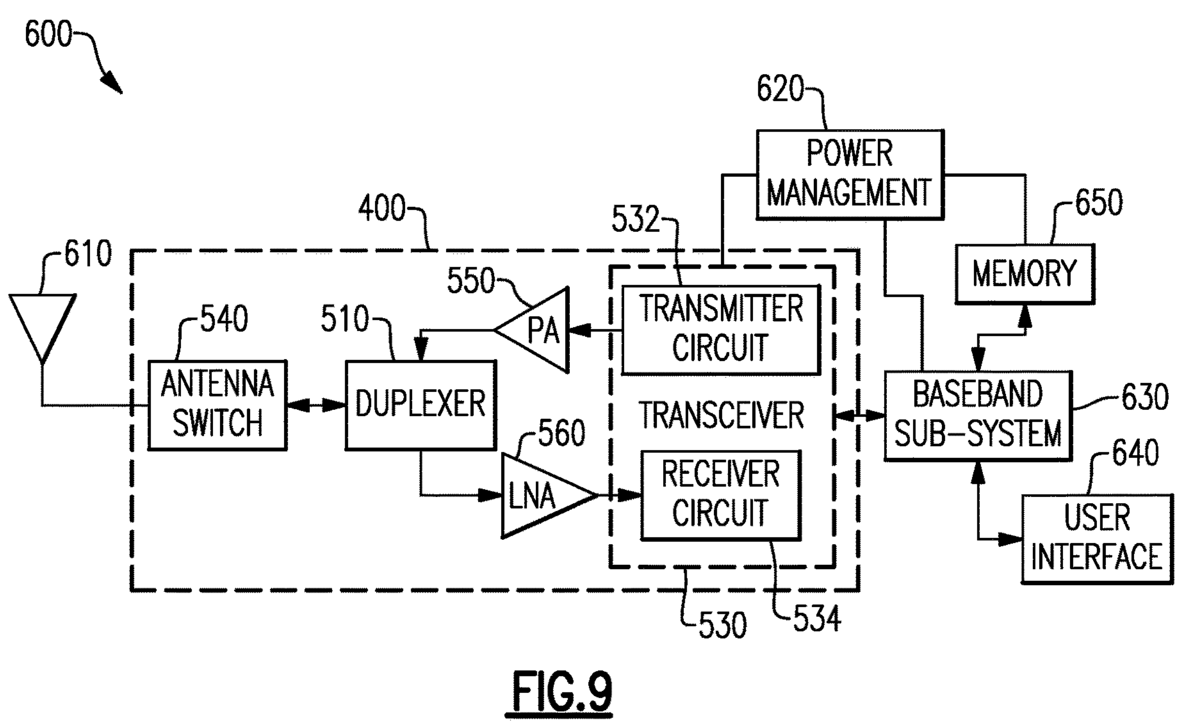
FIG. 9 is a block diagram of one example of a wireless device.

The acoustic wave devices discussed herein can be implemented in a variety of packaged modules. Some example packaged modules will now be discussed in which any suitable principles and advantages of the packaged acoustic wave devices discussed herein can be implemented. FIGS. 7, 8, and 9 are schematic block diagrams of illustrative packaged modules and devices according to certain embodiments.

As discussed above, embodiments of the disclosed BAWs can be configured as or used in filters, for example. In turn, a BAW filter using one or more BAW elements may be incorporated into and packaged as a module that may ultimately be used in an electronic device, such as a wireless communications device, for example. FIG. 7 is a block diagram illustrating one example of a module 400 including a BAW filter 410. The BAW filter 410 may be implemented on one or more die(s) 420 including one or more connection pads 422. For example, the BAW filter 410 may include a connection pad 422 that corresponds to an input contact for the BAW filter and another connection pad 422 that corresponds to an output contact for the BAW filter. The packaged module 400 includes a packaging substrate 430 that is configured to receive a plurality of components, including the die 420. A plurality of connection pads 432 can be disposed on the packaging substrate 430, and the various connection pads 422 of the BAW filter die 420 can be connected to the connection pads 432 on the packaging substrate 430 via electrical connectors 434, which can be solder bumps or wirebonds, for example, to allow for passing of various signals to and from the BAW filter 410. The module 400 may optionally further include other circuitry die 440, such as, for example, one or more additional filter(s), amplifiers, pre-filters, modulators, demodulators, down converters, and the like, as would be known to one of skill in the art of semiconductor fabrication in view of the disclosure herein. In some embodiments, the module 400 can also include one or more packaging structures to, for example, provide protection and facilitate easier handling of the module 400. Such a packaging structure can include an overmold formed over the packaging substrate 430 and dimensioned to substantially encapsulate the various circuits and components thereon.

Various examples and embodiments of the BAW filter 410 can be used in a wide variety of electronic devices. For example, the BAW filter 410 can be used in an antenna duplexer, which itself can be incorporated into a variety of electronic devices, such as RF front-end modules and communication devices.

Referring to FIG. 8, there is illustrated a block diagram of one example of a front-end module 500, which may be used in an electronic device such as a wireless communications device (e.g., a mobile phone) for example. The front-end module 500 includes an antenna duplexer 510 having a common node 502, an input node 504, and an output node 506. An antenna 610 is connected to the common node 502.

The antenna duplexer 510 may include one or more transmission filters 512 connected between the input node 504 and the common node 502, and one or more reception filters 514 connected between the common node 502 and the output node 506. The passband(s) of the transmission filter(s) are different from the passband(s) of the reception filter(s). Examples of the BAW filter 410 can be used to form the transmission filter(s) 512 and/or the reception filter(s) 514. An inductor or other matching component 520 may be connected at the common node 502.

The front-end module 500 further includes a transmitter circuit 532 connected to the input node 504 of the duplexer 510 and a receiver circuit 534 connected to the output node 506 of the duplexer 510. The transmitter circuit 532 can generate signals for transmission via the antenna 610, and the receiver circuit 534 can receive and process signals received via the antenna 610. In some embodiments, the receiver and transmitter circuits are implemented as separate components, as shown in FIG. 8, however in other embodiments these components may be integrated into a common transceiver circuit or module. As will be appreciated by those skilled in the art, the front-end module 500 may include other components that are not illustrated in FIG. 8 including, but not limited to, switches, electromagnetic couplers, amplifiers, processors, and the like.

FIG. 9 is a block diagram of one example of a wireless device 600 including the antenna duplexer 510 shown in FIG. 8. The wireless device 600 can be a cellular phone, smart phone, tablet, modem, communication network or any other portable or non-portable device configured for voice or data communication. The wireless device 600 can receive and transmit signals from the antenna 610. The wireless device includes an embodiment of a front-end module 500 similar to that discussed above with reference to FIG. 8. The front-end module 500 includes the duplexer 510, as discussed above. In the example shown in FIG. 9 the front-end module 500 further includes an antenna switch 540, which can be configured to switch between different frequency bands or modes, such as transmit and receive modes, for example. In the example illustrated in FIG. 9, the antenna switch 540 is positioned between the duplexer 510 and the antenna 610; however, in other examples the duplexer 510 can be positioned between the antenna switch 540 and the antenna 610. In other examples the antenna switch 540 and the duplexer 510 can be integrated into a single component.

The front-end module 500 includes a transceiver 530 that is configured to generate signals for transmission or to process received signals. The transceiver 530 can include the transmitter circuit 532, which can be connected to the input node 504 of the duplexer 510, and the receiver circuit 534, which can be connected to the output node 506 of the duplexer 510, as shown in the example of FIG. 8.

Signals generated for transmission by the transmitter circuit 532 are received by a power amplifier (PA) module 550, which amplifies the generated signals from the transceiver 530. The power amplifier module 550 can include one or more power amplifiers. The power amplifier module 550 can be used to amplify a wide variety of RF or other frequency-band transmission signals. For example, the power amplifier module 550 can receive an enable signal that can be used to pulse the output of the power amplifier to aid in transmitting a wireless local area network (WLAN) signal or any other suitable pulsed signal. The power amplifier module 550 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 550 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 9, the front-end module 500 may further include a low noise amplifier module 560, which amplifies received signals from the antenna 610 and provides the amplified signals to the receiver circuit 534 of the transceiver 530.

The wireless device 600 of FIG. 9 further includes a power management sub-system 620 that is connected to the transceiver 530 and manages the power for the operation of the wireless device 600. The power management system 620 can also control the operation of a baseband sub-system 630 and various other components of the wireless device 600. The power management system 620 can include, or can be connected to, a battery (not shown) that supplies power for the various components of the wireless device 600. The power management system 620 can further include one or more processors or controllers that can control the transmission of signals, for example. In one embodiment, the baseband sub-system 630 is connected to a user interface 640 to facilitate various input and output of voice and/or data provided to and received from the user. The baseband sub-system 630 can also be connected to memory 650 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A film bulk acoustic wave resonator comprising:
- a substrate including a layer of dielectric material disposed on an upper surface of the substrate;
- a layer of piezoelectric material;
- a top electrode disposed on a top surface of the layer of piezoelectric material;
- a bottom electrode disposed on a bottom surface of the layer of piezoelectric material, a cavity defined between a lower surface of the bottom electrode and an upper surface of the layer of dielectric material; and
- a layer of conductive material buried within the layer of dielectric material and disposed beneath only a portion of the cavity and the bottom electrode.

2. The film bulk acoustic wave resonator of claim 1 wherein at least a portion of an upper surface of the layer of conductive material is disposed beneath the upper surface of the layer of dielectric material.

3. The film bulk acoustic wave resonator of claim 2 wherein at least a portion of a lower surface of the layer of conductive material is disposed above a lower surface of the layer of dielectric material.

4. The film bulk acoustic wave resonator of claim 1 wherein the layer of conductive material is electrically connected to the top electrode.

5. The film bulk acoustic wave resonator of claim 4 wherein a portion of the layer of conductive material extends outward from an area beneath the cavity and electrically connects to a top electrical contact that is electrically connected to the top electrode.

6. The film bulk acoustic wave resonator of claim 4 further comprising a through-substrate via passing through the substrate and electrically connecting the layer of conducting material to an electrical contact disposed on a lower surface of the substrate.

7. The film bulk acoustic wave resonator of claim 1 wherein the layer of conductive material is electrically connected to neither the top electrode nor the bottom electrode.

8. The film bulk acoustic wave resonator of claim 7 wherein the layer of conductive material is electrically floating.

9. The film bulk acoustic wave resonator of claim 7 wherein the layer of conductive material is disposed entirely beneath the cavity.

10. The film bulk acoustic wave resonator of claim 7 further comprising a through-substrate via passing through the substrate and electrically connecting the layer of conducting material to an electrical contact disposed on a lower surface of the substrate.

11. The film bulk acoustic wave resonator of claim 1 wherein the layer of conductive material is electrically connected to the bottom electrode.

12. The film bulk acoustic wave resonator of claim 11 wherein the layer of conductive material is directly connected to the bottom electrode.

13. The film bulk acoustic wave resonator of claim 11 further comprising a through-substrate via passing through the substrate and electrically connecting the layer of conducting material to an electrical contact disposed on a lower surface of the substrate.

14. The film bulk acoustic wave resonator of claim 1 wherein the layer of conductive material changes an electromechanical coupling coefficient of the film bulk acoustic wave resonator.

15. The film bulk acoustic wave resonator of claim 1 wherein the layer of conductive material lowers an electromechanical coupling coefficient of the film bulk acoustic wave resonator.

16. The film bulk acoustic wave resonator of claim 1 wherein the layer of conductive material defines a first plate of a capacitor and one of the top electrode or the bottom electrode defines a second plate of the capacitor.

17. A ladder filter including a series arm film bulk acoustic wave resonator comprising:

a substrate including a layer of dielectric material disposed on an upper surface of the substrate;

a layer of piezoelectric material;

a top electrode disposed on a top surface of the layer of piezoelectric material;

a bottom electrode disposed on a bottom surface of the layer of piezoelectric material, a cavity defined between a lower surface of the bottom electrode and an upper surface of the layer of dielectric material; and a layer of conductive material buried within the layer of dielectric material and disposed beneath only a portion of the cavity and bottom electrode.

18. The ladder filter of claim 17 further comprising a capacitor electrically connected in parallel to the series arm film bulk acoustic wave resonator.

19. The ladder filter of claim 18 wherein the layer of conductive material defines a first plate of the capacitor and one of the top electrode or the bottom electrode defines a second plate of the capacitor.

20. An electronic device including the ladder filter of claim 19.

* * * * *